United States Patent
Yang et al.

(10) Patent No.: US 9,275,861 B2
(45) Date of Patent: Mar. 1, 2016

(54) METHODS OF FORMING GROUP III-V SEMICONDUCTOR MATERIALS ON GROUP IV SUBSTRATES AND THE RESULTING SUBSTRATE STRUCTURES

(71) Applicant: GLOBALFOUNDRIES Inc., Grand Cayman (KY)

(72) Inventors: Li Yang, San Jose, CA (US); Kejia Wang, Poughkeepsie, NY (US); Ashish Baraskar, White Plains, NY (US); Bin Yang, San Carlos, CA (US); Shurong Liang, Poughkeepsie, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 210 days.

(21) Appl. No.: 13/927,685

(22) Filed: Jun. 26, 2013

(65) Prior Publication Data

US 2015/0001587 A1    Jan. 1, 2015

(51) Int. Cl.
| | | |
|---|---|---|
| H01L 21/02 | (2006.01) | |
| H01L 29/04 | (2006.01) | |
| H01L 29/20 | (2006.01) | |

(52) U.S. Cl.
CPC ...... *H01L 21/02658* (2013.01); *H01L 21/0243* (2013.01); *H01L 21/02373* (2013.01); *H01L 21/02538* (2013.01); *H01L 29/045* (2013.01); *H01L 29/20* (2013.01)

(58) Field of Classification Search
CPC .............. H01L 21/02373; H01L 21/0243; H01L 21/02538; H01L 21/02658; H01L 29/045; H01L 29/20
See application file for complete search history.

(56) References Cited

U.S. PATENT DOCUMENTS

| | | | |
|---|---|---|---|
| 3,636,421 A * | 1/1972 | Takeishi et al. | 257/405 |
| 4,642,145 A | 2/1987 | Masumoto et al. | |
| 4,891,091 A | 1/1990 | Shastry | |
| 4,946,547 A | 8/1990 | Palmour et al. | |
| 5,043,773 A | 8/1991 | Precht et al. | |
| 5,081,519 A | 1/1992 | Nishimura | |
| 5,190,890 A | 3/1993 | Precht et al. | |
| 5,230,768 A | 7/1993 | Furukawa et al. | |
| 5,279,701 A | 1/1994 | Shigeta et al. | |
| 5,308,444 A | 5/1994 | Fitzgerald, Jr. et al. | |
| 5,618,217 A * | 4/1997 | Then et al. | 445/35 |
| 5,817,222 A | 10/1998 | Kaneko | |
| 5,840,166 A | 11/1998 | Kaneko | |
| 5,964,968 A | 10/1999 | Kaneko | |
| 6,022,789 A * | 2/2000 | Takase | 438/431 |
| 6,045,932 A | 4/2000 | Jia et al. | |
| 6,156,706 A | 12/2000 | Divin et al. | |
| 6,248,453 B1 | 6/2001 | Watson | |
| 6,736,894 B2 | 5/2004 | Kawahara et al. | |
| 6,784,074 B2 | 8/2004 | Shchukin et al. | |
| 6,805,744 B2 | 10/2004 | Kim et al. | |
| 6,936,851 B2 * | 8/2005 | Wang | 257/79 |

(Continued)

*Primary Examiner* — Marvin Payen
*Assistant Examiner* — Victor Barzykin
(74) *Attorney, Agent, or Firm* — Amerson Law Firm, PLLC

(57) ABSTRACT

One method disclosed herein includes forming a patterned mask layer above a surface of a semiconductor substrate, performing at least one etching process through the patterned mask layer to define a plurality of intersecting ridges that define a ridged surface in the substrate, and forming a Group III-V material on the ridged surface of the substrate. An illustrative device disclosed herein includes a Group IV substrate having a ridged surface comprised of a plurality of intersecting ridges and a Group III-V material layer positioned on the ridged surface of the Group IV substrate.

10 Claims, 12 Drawing Sheets

(56) References Cited

U.S. PATENT DOCUMENTS

| | | |
|---|---|---|
| 7,101,444 B2 | 9/2006 | Shchukin et al. |
| 7,101,774 B2 | 9/2006 | Nagasawa et al. |
| 7,164,187 B2 | 1/2007 | Nagasawa |
| 7,208,044 B2 | 4/2007 | Zurbuchen |
| 7,329,593 B2 | 2/2008 | Bauer et al. |
| 7,459,222 B2 | 12/2008 | Shvets et al. |
| 7,479,443 B2 | 1/2009 | Bauer et al. |
| 7,560,296 B2 | 7/2009 | Frayssinet et al. |
| 7,713,640 B2 | 5/2010 | Zurbuchen |
| 7,718,469 B2 | 5/2010 | Hasan |
| 7,732,067 B2 | 6/2010 | Zurbuchen |
| 7,892,970 B2 | 2/2011 | Hasan |
| 7,902,119 B2 | 3/2011 | Wu et al. |
| 7,919,435 B2 | 4/2011 | Goyal |
| 8,030,101 B2 | 10/2011 | Frayssinet et al. |
| 8,163,403 B2 | 4/2012 | Zurbuchen |
| 8,221,909 B2 | 7/2012 | Aytug et al. |
| 8,283,239 B2 | 10/2012 | Beaumont et al. |
| 8,313,967 B1 | 11/2012 | Lee et al. |
| 8,362,460 B2 | 1/2013 | Puetz et al. |
| 8,722,441 B2 * | 5/2014 | Pan et al. ......... 438/44 |
| 2006/0169987 A1 * | 8/2006 | Miura et al. ......... 257/79 |
| 2011/0049681 A1 * | 3/2011 | Vielemeyer ......... 257/627 |
| 2012/0241809 A1 * | 9/2012 | Pan et al. ......... 257/99 |
| 2013/0082279 A1 | 4/2013 | Faurie et al. |

\* cited by examiner

○ Group IV Atoms
● Group V Atoms
◎ Group III Atoms

METHODS OF FORMING GROUP III-V SEMICONDUCTOR MATERIALS ON GROUP IV SUBSTRATES AND THE RESULTING SUBSTRATE STRUCTURES

BACKGROUND OF THE INVENTION

1. Field of the Invention

Generally, the present disclosure relates to the manufacture of semiconductor devices, and, more specifically, to various methods of forming Group III-V semiconductor materials on Group IV substrates, and the resulting substrate structures.

2. Description of the Related Art

The most commonly used semiconductor materials are crystalline inorganic solids. Semiconductor materials are typically classified according to the periodic table group of their constituent atoms. Different semiconductor materials have different electrical and mechanical properties. Silicon is the most perfect crystalline material among known semiconductor materials. The abundance of silicon and the capability to fabricate single crystalline silicon wafers as large as 12" have led to the economical production and domestication of ultra-large scale integrated (ULSI) circuits and integrated circuit products that are used in almost every aspect of daily life.

However, silicon cannot meet the demands of some optical devices or high speed, high power electronics. For example, silicon is an indirect band gap material which makes silicon an extremely inefficient light emitter. Thus, as compared to silicon, compound semiconductors have both advantages and disadvantages. For example, gallium arsenide (GaAs) has about six times higher electron mobility than does silicon, which allows for faster operation, a wider band gap, which allows operation of power devices at higher temperatures, and it is a direct band gap material that has more favorable optoelectronic properties than the indirect band gap of silicon. Moreover, gallium arsenide can be alloyed to ternary and quaternary compositions, with adjustable band gap width, allowing light emission at chosen wavelengths. Gallium arsenide can also be grown in a semi-insulating form, which is suitable as a lattice-matching insulating substrate for gallium arsenide devices. Conversely, silicon is robust, cheap and is readily available in the form of large wafers, whereas gallium arsenide is brittle and expensive. Therefore, it would be desirable to integrate III-V materials on silicon substrates so as to reduce processing costs while still maintaining the functionality of the devices made on the integrated III-V materials.

When depositing a Group III-V material, for example GaAs, epitaxially on a Group IV substrate, for example, a substrate comprised of silicon, germanium or silicon-germanium ($Si_xGe_{1-x}$), the formation of the atomic layer sequence of the Group III atoms and the Group V layer atoms is not readily established. Typically, there are boundary regions between these different growth areas that can give rise to considerable structural defects, i.e., so-called anti-phase boundaries, which may adversely affect the performance of the resulting electronic device formed thereon. The reason such anti-phase boundaries are created is because, at an atomic level, there are always "steps" in the surface of the Group IV substrate. Such atomic level steps, especially single-steps, cause undesirable Group III-III bonding and Group V-V bonding.

FIGS. 1A-1B simplistically depict an illustrative example of such an anti-phase boundary. As shown in FIG. 1A, a Group III-V material 14 was epitaxially deposited above the surface 12S of an illustrative Group IV substrate 12, e.g., a crystalline silicon substrate. FIG. 1B is a simplistic, atomic-level depiction of the interface between the Group III-V material 14 and the Group IV substrate 12. As depicted, the Group III atoms (cross-hatched circles) and the Group V atoms (dark circles) are formed above the Group IV atoms (open circles) of the substrate 12. The surface 12S of the Group IV substrate 12 is depicted in FIG. 1B with a dashed line. As can be seen in FIG. 1B, in regions 16, there is anti-phase bonding between adjacent Group V atoms, while in regions 18 there is anti-phase bonding between adjacent Group III atoms. Such anti-phase bonds are problematic in that they tend to be weaker in strength and they also interrupt the period structure of the material. They also lead to the creation of the schematically depicted anti-phase boundary 20—a defect—which can adversely affect the electrical and/or mechanical properties of a device formed above or near the anti-phase boundary 20. For example, a transistor device formed above or near such an anti-phase boundary 20 may exhibit increased leakage currents and/or slower operating speed due to decreased charge carrier mobility at or near the anti-phase boundary 20. The ultimate cause of such anti-phase bonding is believed to be the creation of single (or odd) atomic layer "steps" on the (001) surface of the Group IV substrate 12, as depicted within the dashed line 22 in FIG. 1B.

In an attempt to avoid the undesirable anti-phase bonding, Group III-V materials are sometimes formed above Group IV vicinal substrates (a substrate whose surface normal deviates slightly from a major crystallographic axis) with an off-cut angle ranging from 0-15 degrees, or any other suitable angle. Such vicinal substrates have a higher density of such atomic level steps. However, vicinal substrates can be subjected to an anneal process so as to cause the single atomic level steps on the surface of the Group IV substrate to form double steps to eliminate the undesirable anti-phase bonding. However, if such vicinal substrates are used, the III-V materials grown on top will adopt the surface orientation of the vicinal substrate which will cause fabrication difficulties. In general, the off cut surface of a vicinal substrate is more reactive and surface passivation is more challenging.

The present disclosure is directed to various methods of forming Group III-V semiconductor materials on Group IV substrates, and the resulting substrate structures that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming Group III-V semiconductor materials on Group IV substrates, and the resulting substrate structures. In one example, the method disclosed herein includes forming a patterned mask layer above a surface of a semiconductor substrate, performing at least one etching process through the patterned mask layer to define a plurality of intersecting ridges that define a ridged surface in the substrate, and forming a Group III-V material on the ridged surface of the substrate.

Another illustrative method disclosed herein involves forming a patterned mask layer above a surface of a semiconductor substrate, performing at least one etching process through the patterned mask layer to define a plurality of dimples positioned side-by-side in the substrate so as to thereby define a dimpled surface, and forming a Group III-V material on the dimpled surface of the substrate.

One illustrative device disclosed herein includes a Group IV substrate having a ridged surface comprised of a plurality of intersecting ridges and a Group III-V material layer positioned on the ridged surface of the Group IV substrate.

Another illustrative device disclosed herein includes a Group IV substrate having a plurality of dimples positioned side-by-side in the Group IV substrate so as to define a dimpled surface in the substrate and a Group III-V material layer positioned on the dimpled surface of the Group IV substrate.

BRIEF DESCRIPTION OF THE DRAWINGS

The disclosure may be understood by reference to the following description taken in conjunction with the accompanying drawings, in which like reference numerals identify like elements, and in which.

Figure 1A:
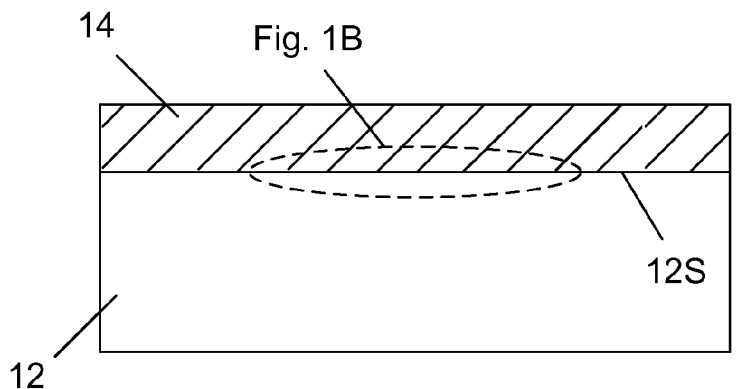
FIGS. 1A-1B depict one illustrative problem involved when forming Group III-V materials on a Group IV substrate.
Figure 1B:
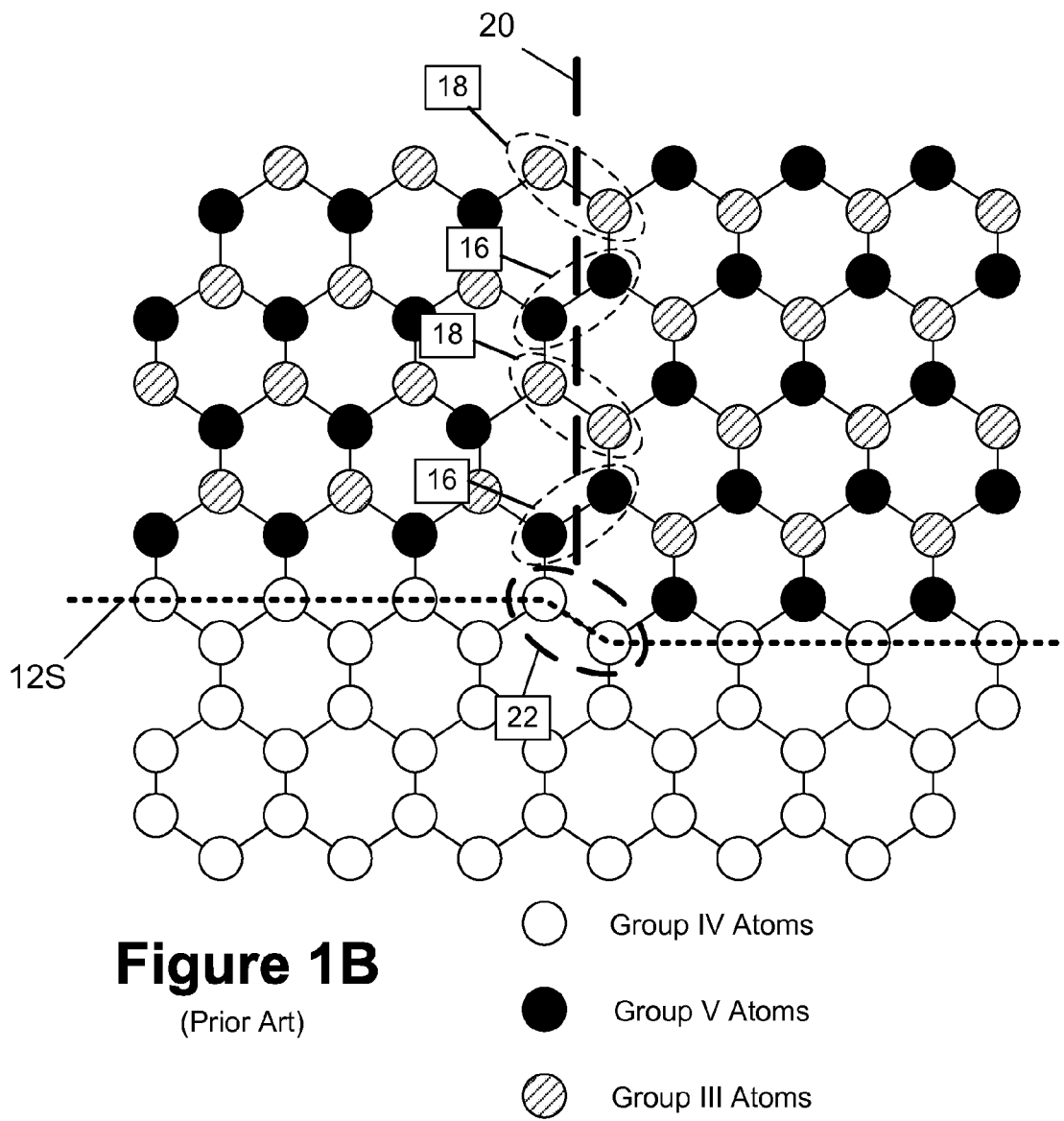

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure is directed to various methods of forming Group III-V semiconductor materials on Group IV substrates, and the resulting substrate structures. Moreover, as will be readily apparent to those skilled in the art upon a complete reading of the present application, the methods disclosed herein may be employed in fabricating a variety of integrated circuit products, including, but not limited to, opto-electronic devices (e.g., in the fabrication of blue and UV light emitting diodes and laser diodes) and in high-frequency, high-temperature and high-power electronics, etc. With reference to the attached figures, various illustrative embodiments of the methods and devices disclosed herein will now be described in more detail.

Figure 2A:
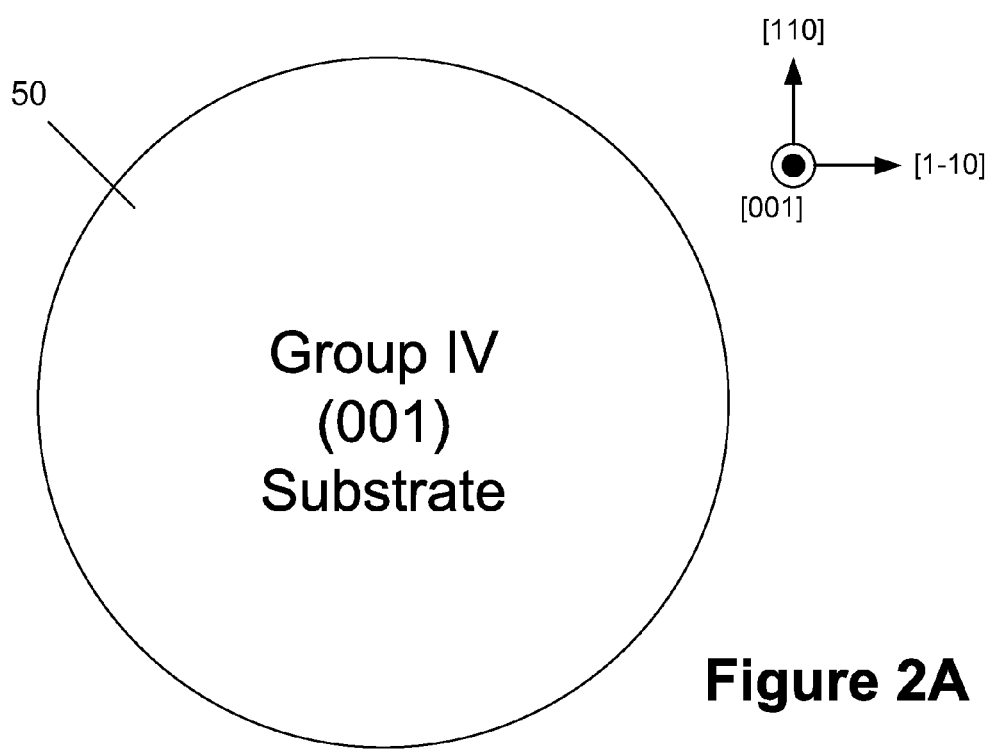
FIGS. 2A-2W depict various methods disclosed herein for forming Group III-V semiconductor materials on Group IV substrates, and illustrative examples of the resulting substrate structures.
Figure 2B:
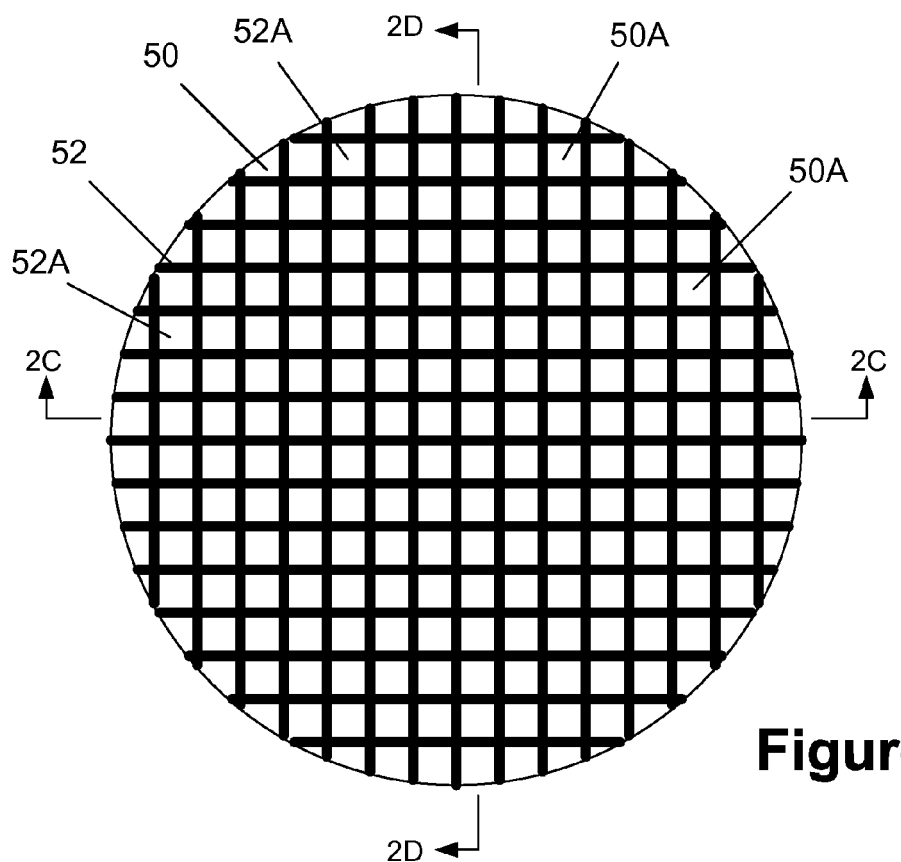
Figure 2C:
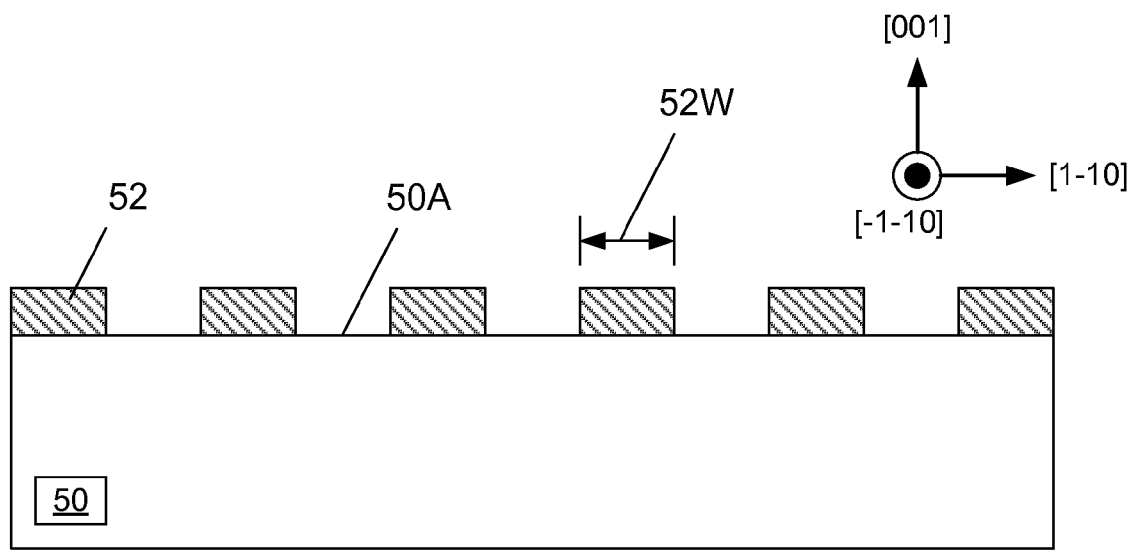
Figure 2D:
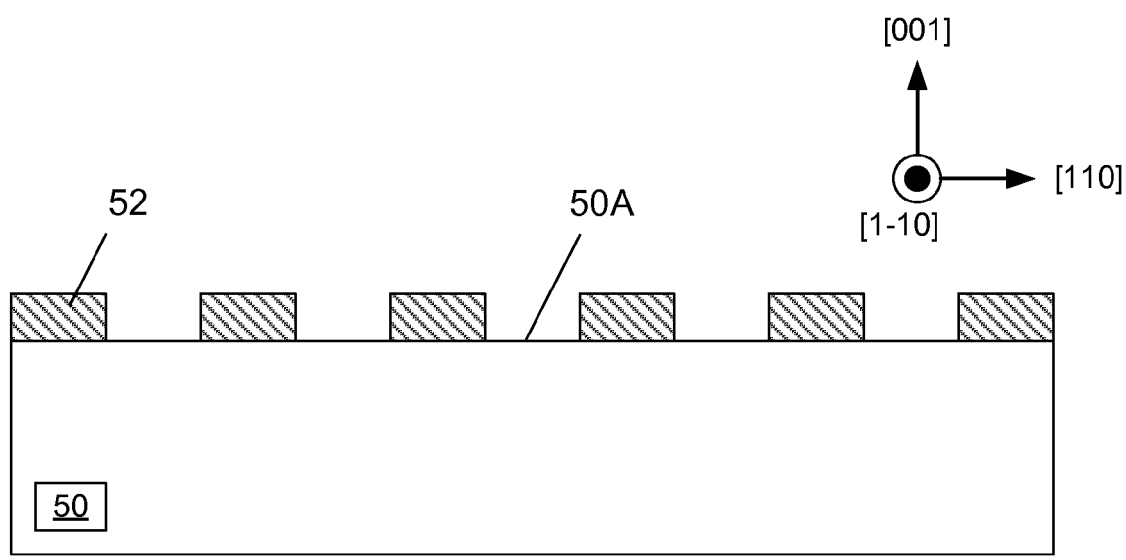
Figure 2E:
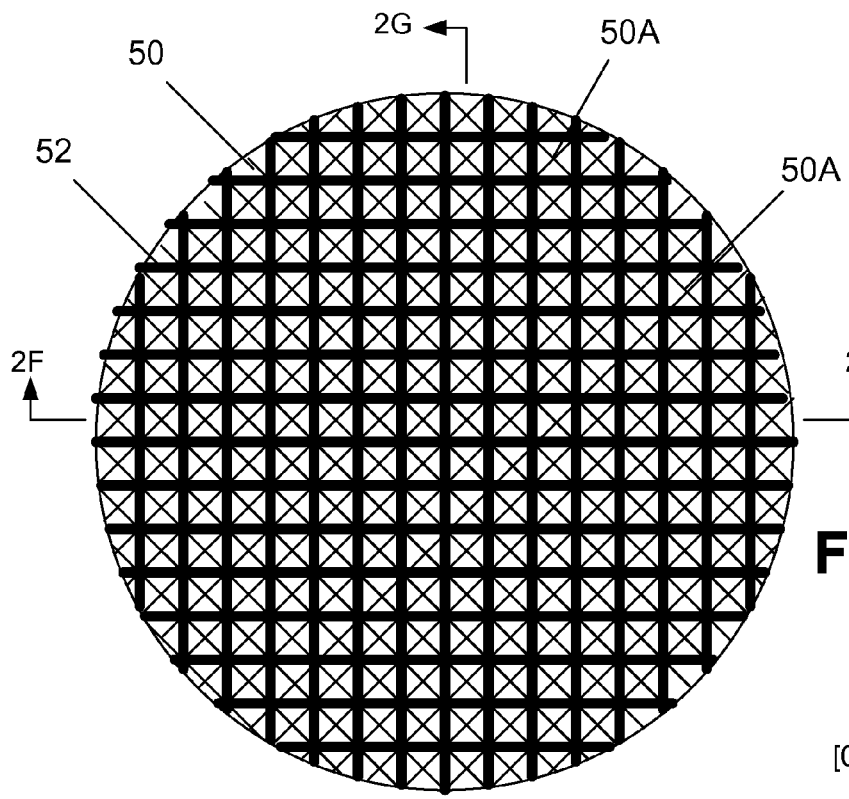
Figure 2F:
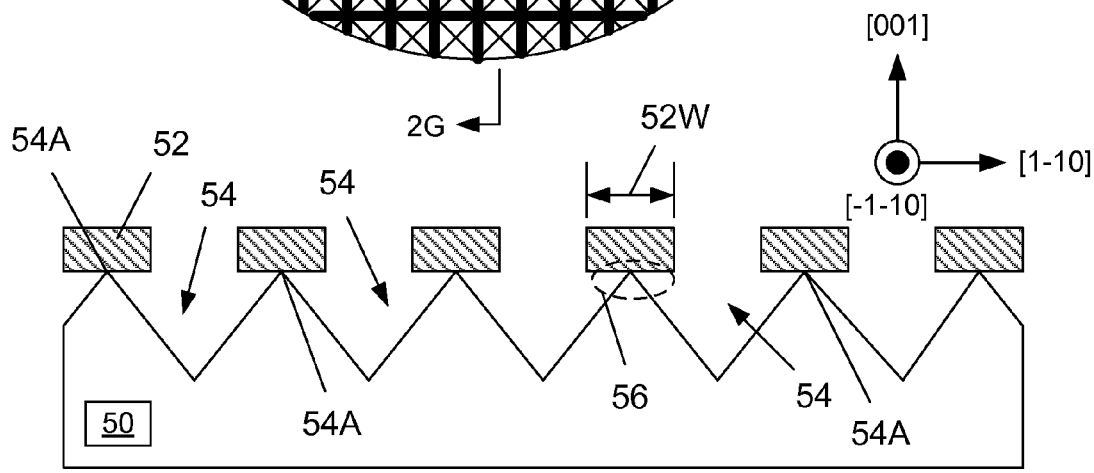
Figure 2G:
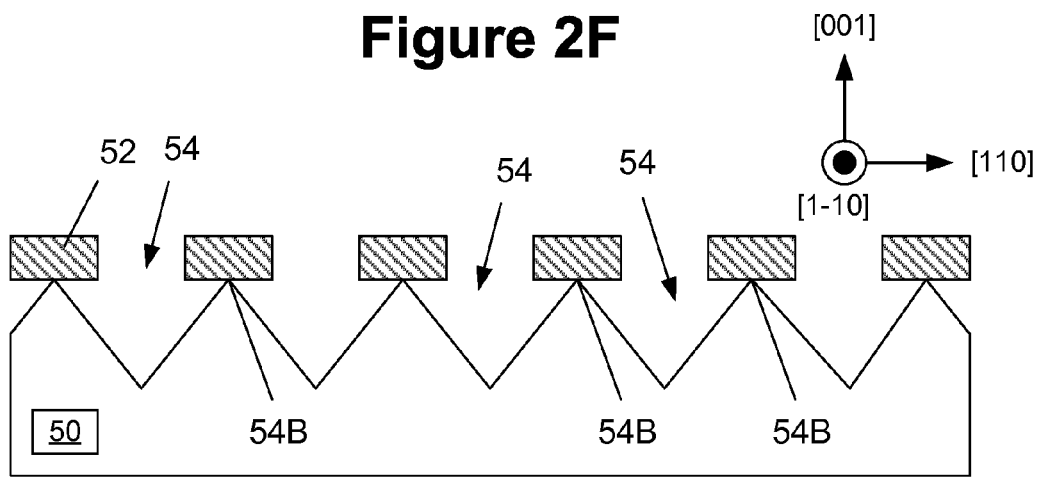
Figure 2H:
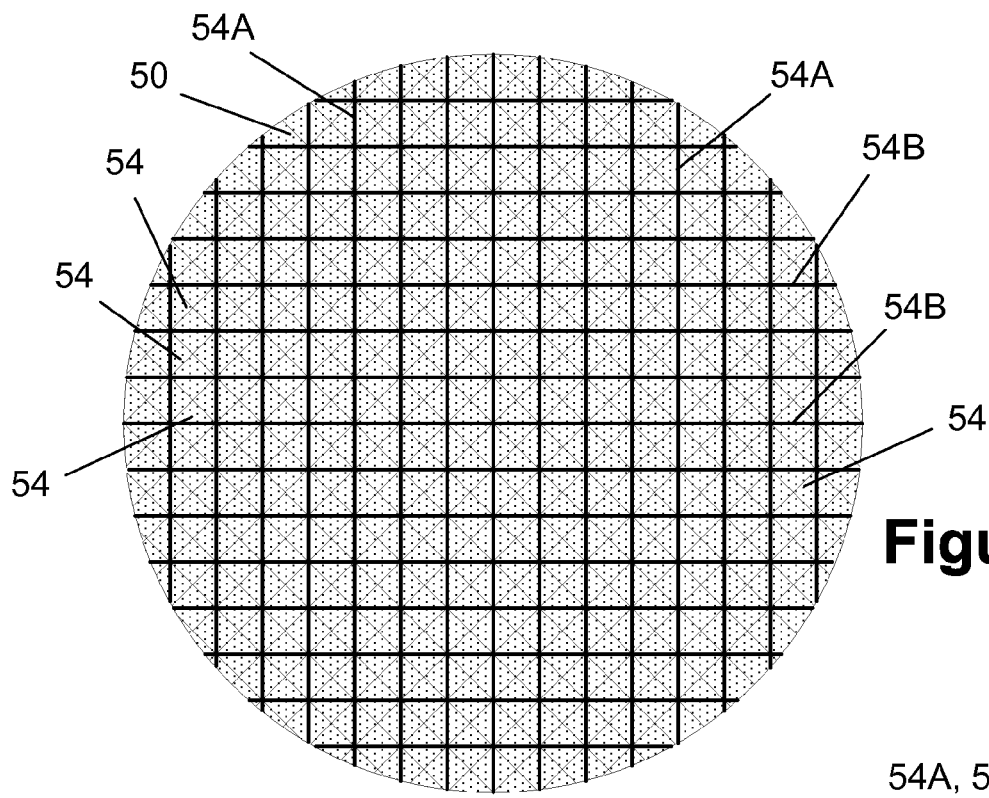
Figure 2I:
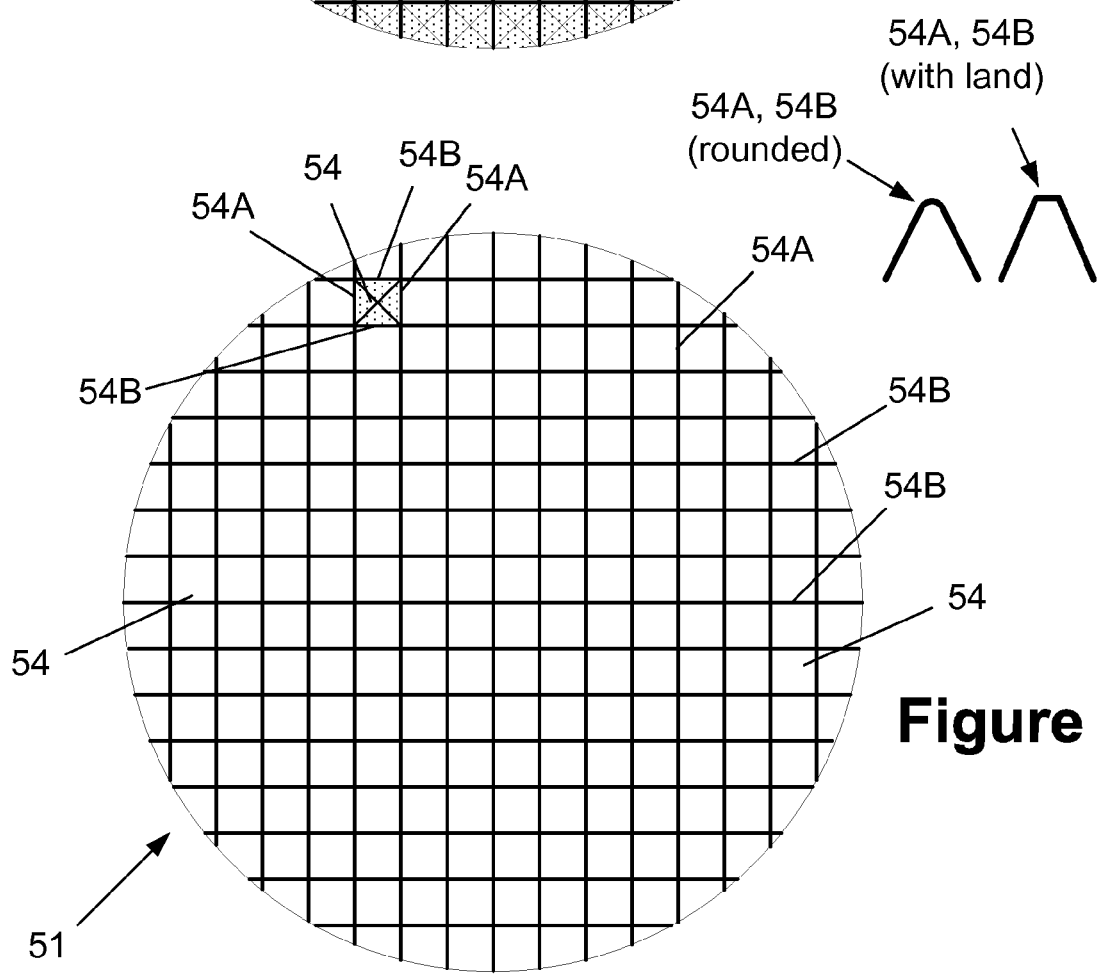
Figure 2J:
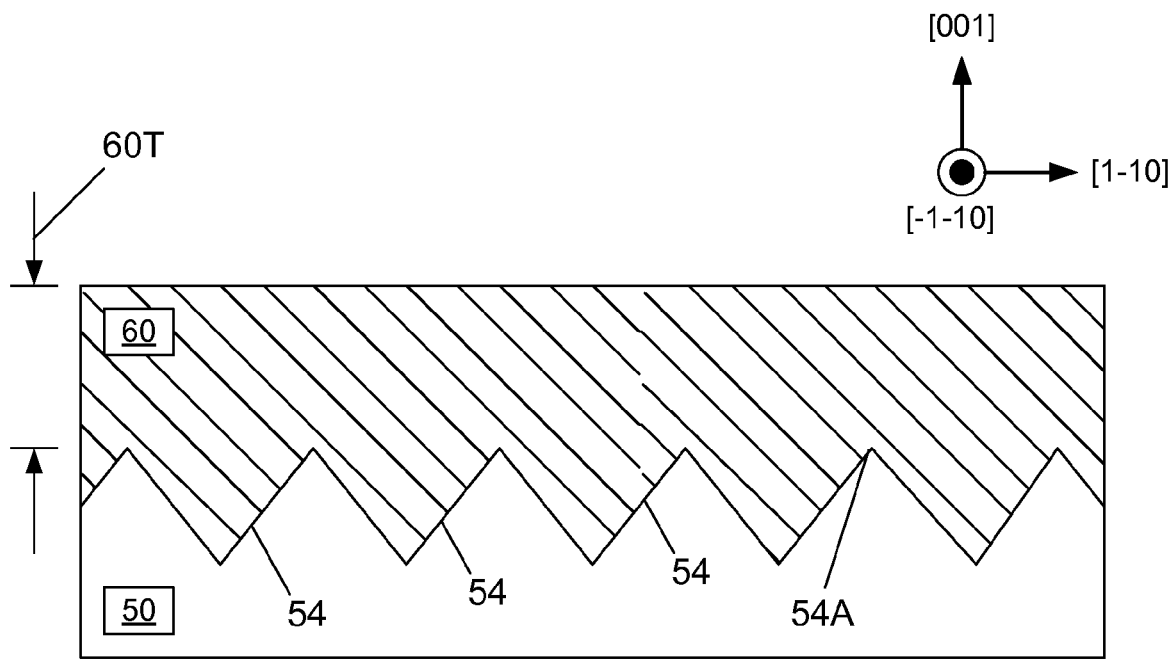
Figure 2K:
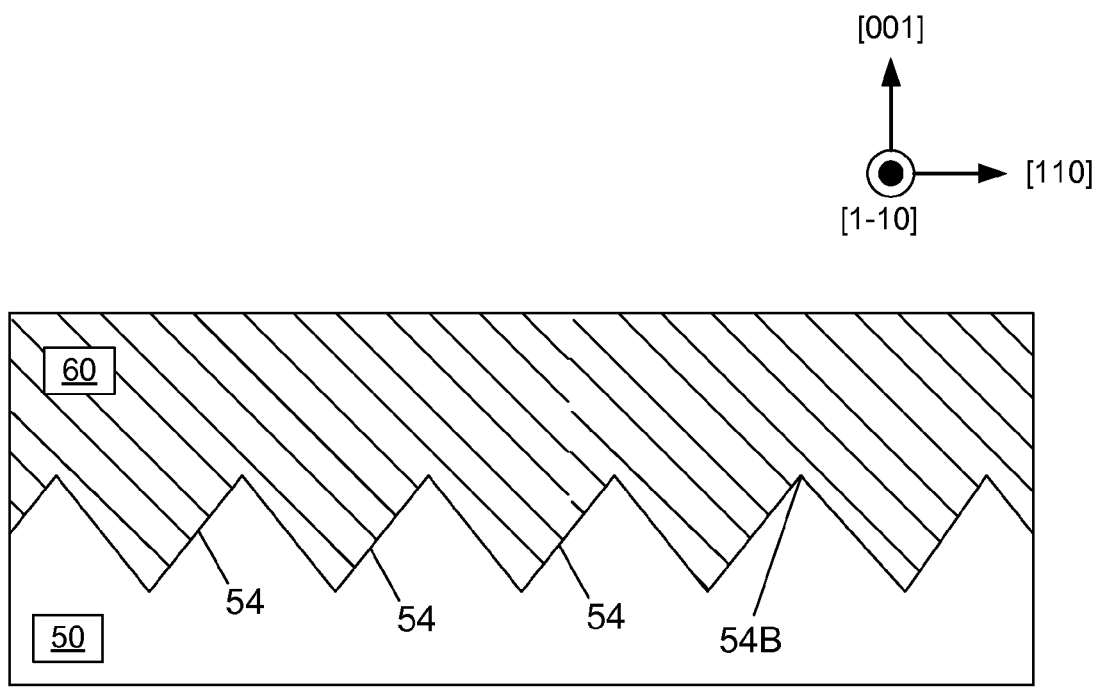
Figure 2L:
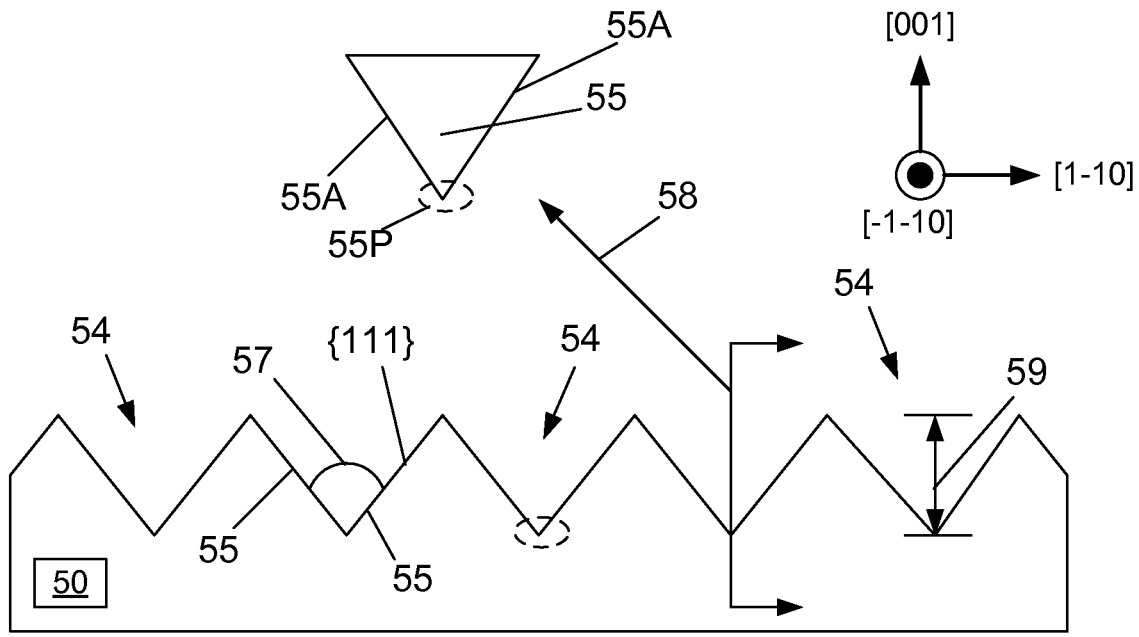
Figure 2M:
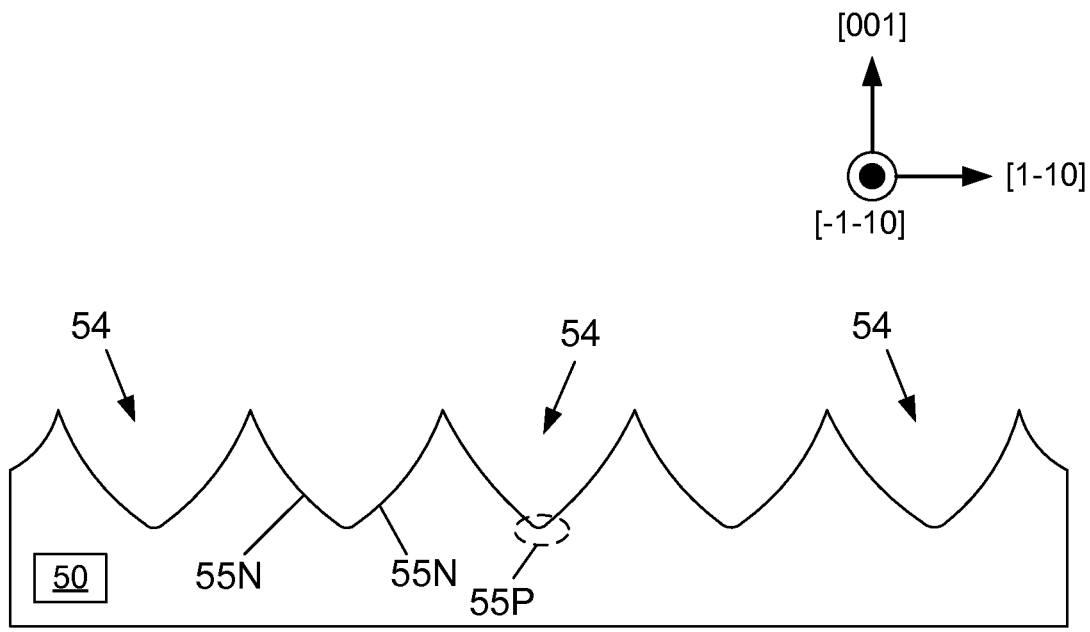
Figure 2N:
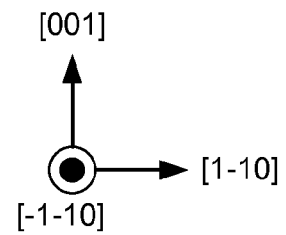
Figure 2N:
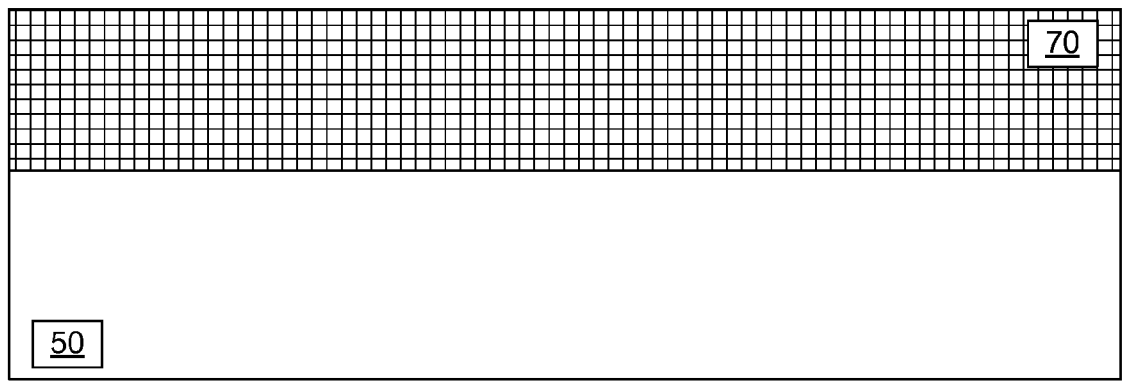
Figure 2O:
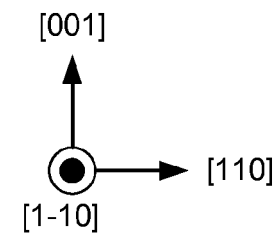
Figure 2O:
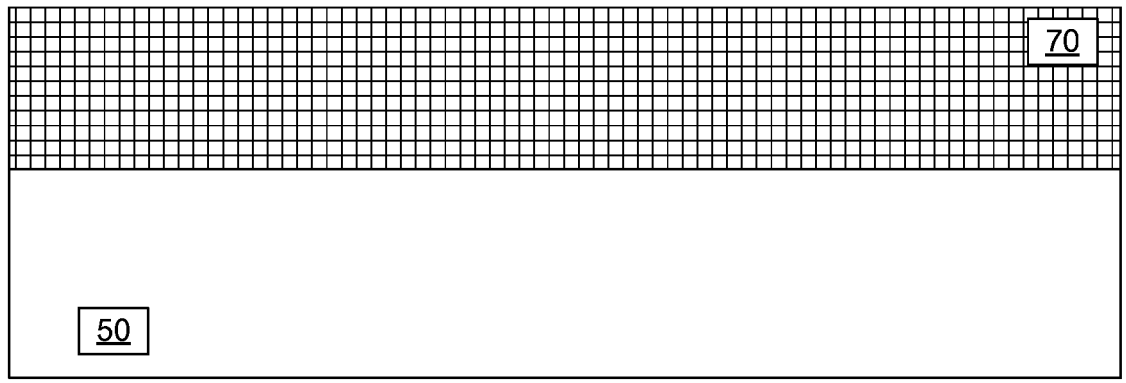
Figure 2P:
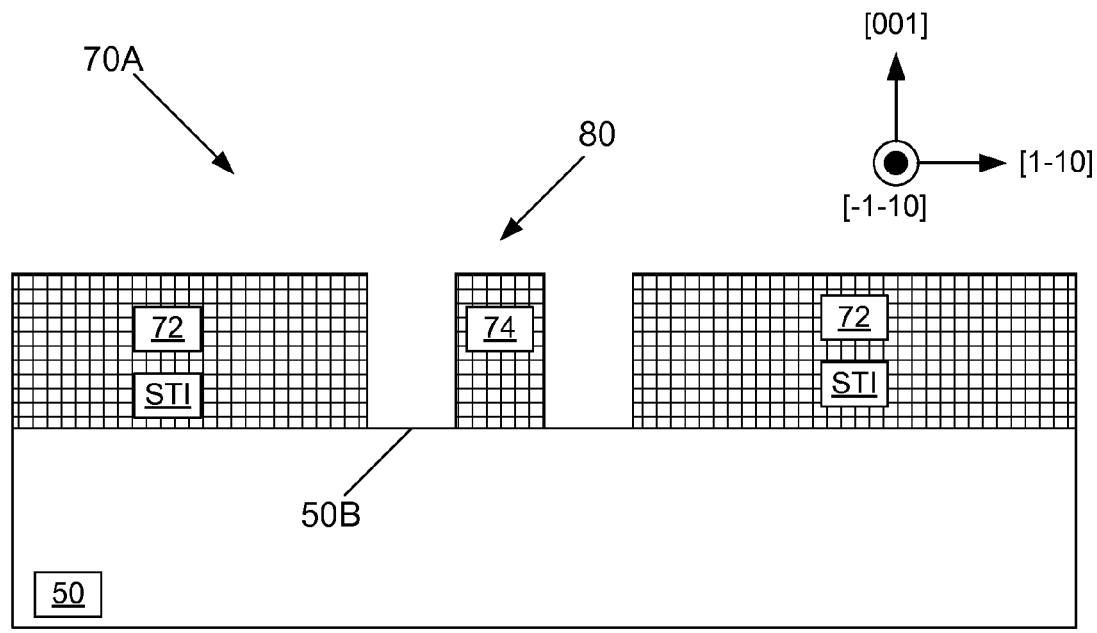
Figure 2Q:
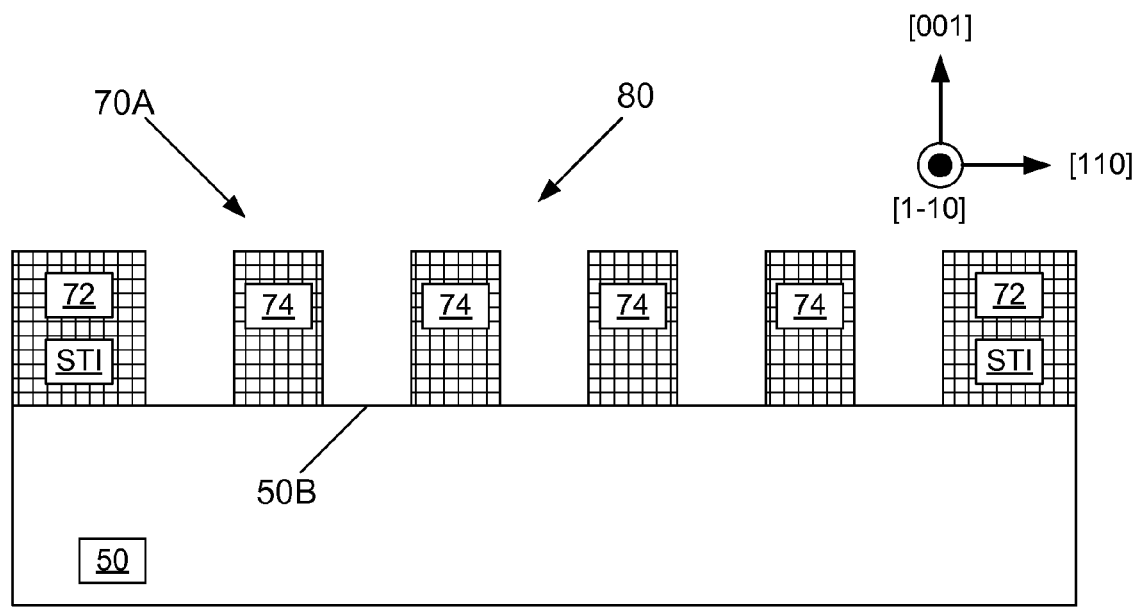
Figure 2R:
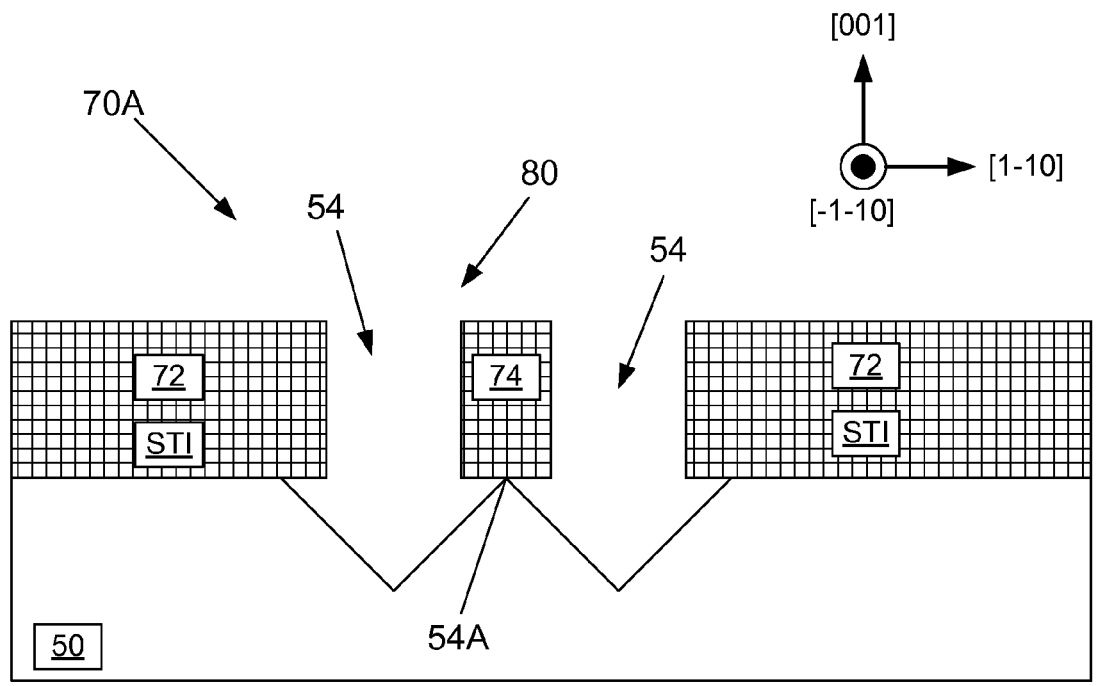
Figure 2S:
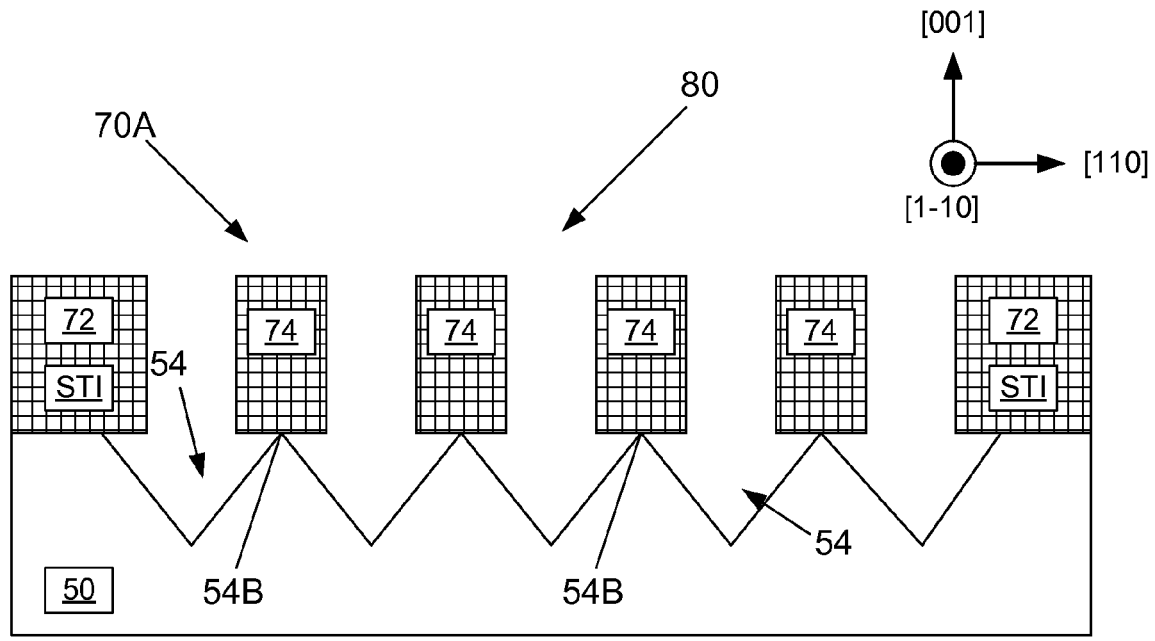
Figure 2T:
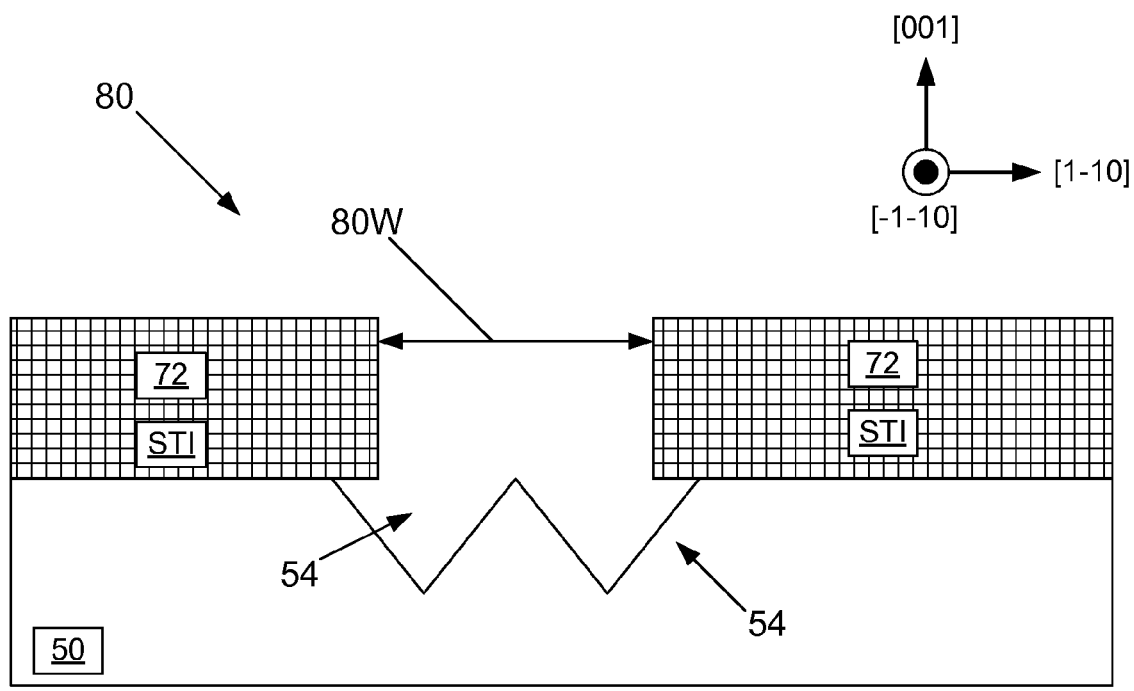
Figure 2U:
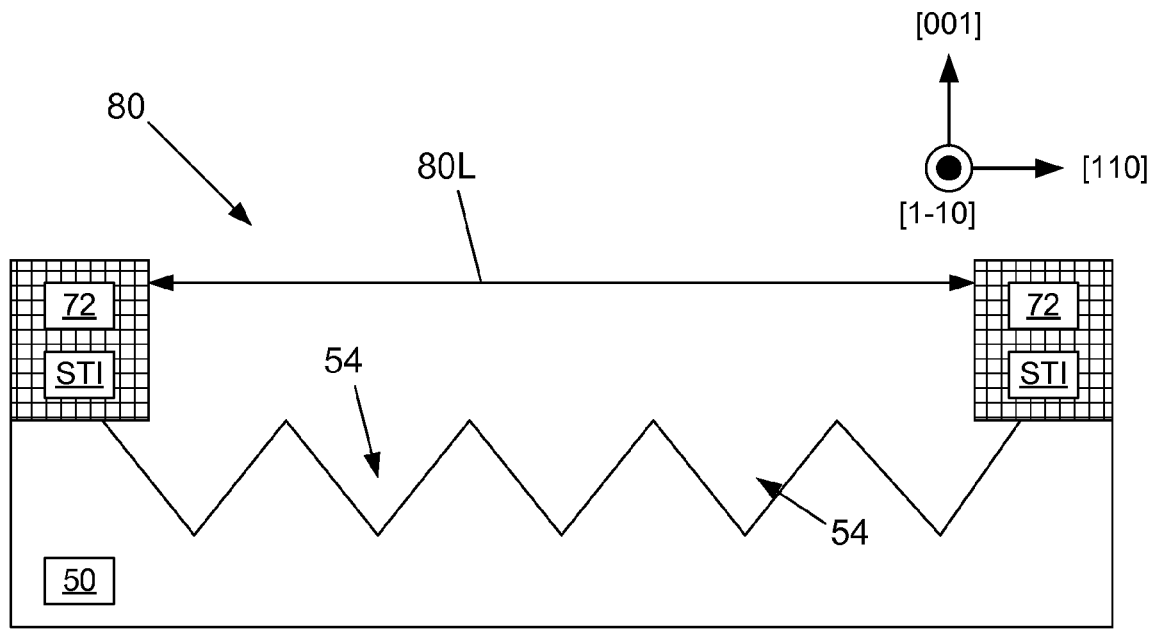
Figure 2V:
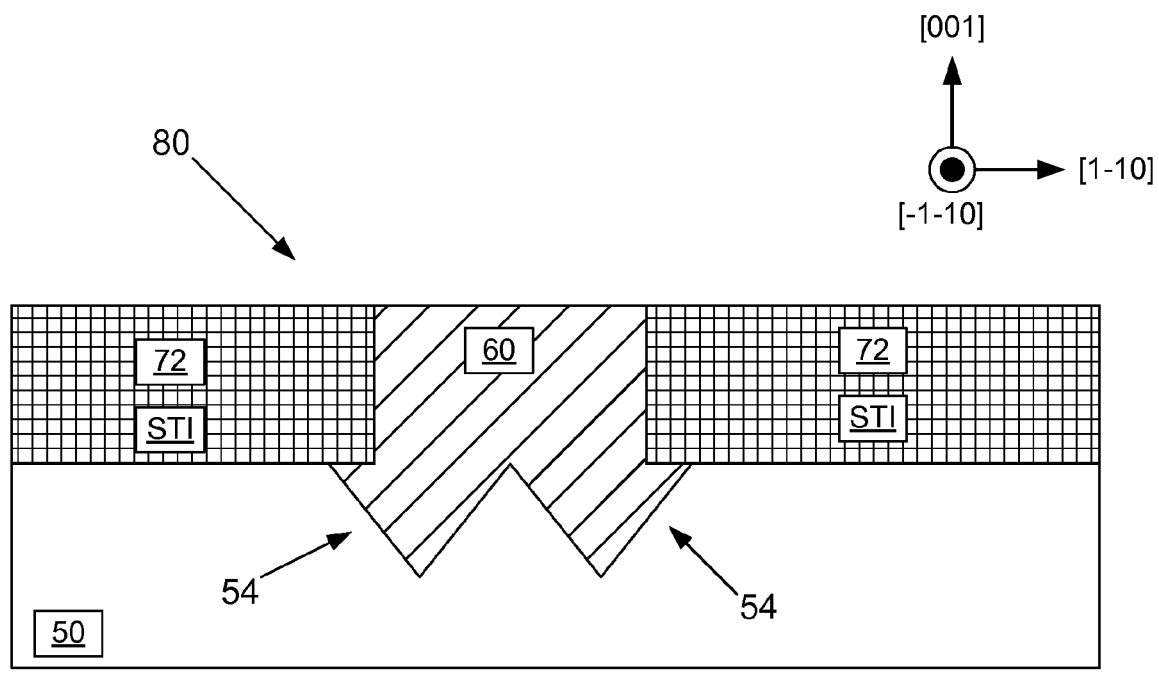
Figure 2W:
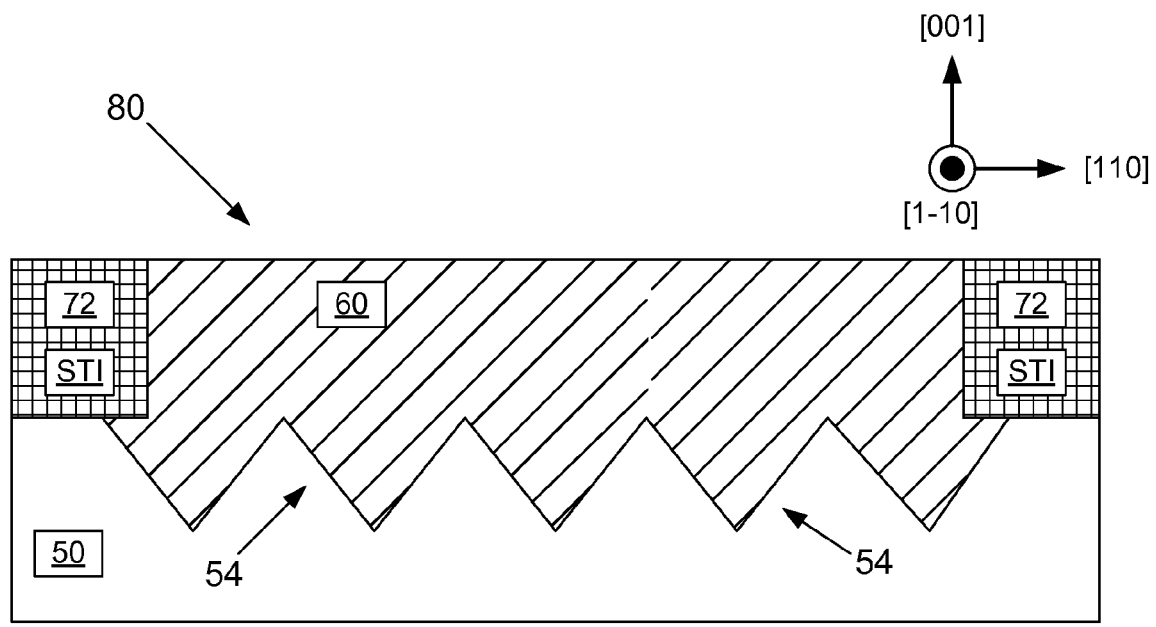

FIGS. 2A-2W depict various methods disclosed herein for forming Group III-V semiconductor materials on Group IV substrates, and illustrative examples of the resulting substrate structures. In general, the presently disclosed inventions are directed to performing an etching process through a patterned mask layer to define an ordered arrangement of dimples or indentations in the surface of a semiconductor substrate. The dimples or indentations are formed in such a manner that, when a layer of a Group III-V material is subsequently formed above the dimpled surface of the substrate, anti-phase bonding may be reduced as compared to the amount of anti-phase bonding that occurred when using prior art methods to form Group III-V materials above a Group IV substrate. The methods disclosed herein may be employed in forming a layer of Group III-V material across an entire Group IV substrate, or it may be employed in forming discrete regions of Group III-V materials above a Group IV substrate using, for example, aspect-ratio-trapping techniques.

FIG. 2A is a plan view of an illustrative Group IV substrate 50 prior to formation of any materials above the substrate 50. In one illustrative embodiment, the Group IV substrate 50 may be a (001) silicon substrate with an upper surface that is positioned in the (001) plane. In some cases, the Group IV substrate 50 may also be comprised of germanium or silicon-germanium ($Si_xGe_{1-x}$), Sn, $Ge_xSn_{1-x}$, etc. The substrate 50 may be in bulk form, as depicted herein, or the Group IV substrate 50 may be the active layer of a so-called silicon-on-insulator (SOI) substrate or a silicon-germanium-on-insulator (SGOI) substrate. Thus, the Group IV substrate 50 should not be considered as limited to any particular form, material (within Group IV) or configuration.

FIG. 2B depicts the device at a point where a patterned masking layer 52 has been formed above the Group IV substrate 50. FIGS. 2C-2D are cross-sectional views of portions of the device depicted in FIG. 2B that are oriented ninety degrees relative to one another. The patterned masking layer 52 exposes a plurality of surface areas 50A of the Group IV substrate 50 for further processing. The patterned masking layer 52 may be comprised of a variety of different materials and it may be formed using a variety of different techniques. For example, the patterned masking layer 52 may be comprised of a variety of materials, e.g., photoresist, silicon dioxide, silicon nitride, and its thickness may vary depending upon the particular application, e.g., 10-1000 nm. In one embodiment, the patterned masking layer 52 may be a patterned layer of photoresist material that may be formed above the surface of the Group IV substrate 50 using known photolithography tools and techniques. In another embodiment, the patterned masking layer 52 may be formed by blanket-depositing a layer of the masking material across the Group IV substrate 50, forming a patterned photoresist mask layer (not shown) above the layer of masking material and thereafter performing an etching process through the patterned photoresist mask layer to thereby remove the exposed portions of the deposited layer of masking material. The patterned photoresist mask may be formed using known photolithography tools and techniques. The initial layer of masking material may be deposited using a variety of known deposition processes, e.g., a chemical vapor deposition (CVD) process. FIG. 2B is a plan view that depicts the Group IV substrate 50 with the patterned masking layer 52 positioned above the upper surface of the substrate 50. If desired, the patterned masking layer 52 may be made of multiple layers of material, e.g., a layer of silicon dioxide combined with a layer of silicon nitride.

In the depicted example, the patterned masking layer 52 is depicted as being formed with a plurality of substantially square-shaped openings 52A that expose underlying portions 50A of the Group IV substrate 50. However, as will be appreciated by those skilled in the art after a complete reading of the present application, the shape and size of the openings 52A in the patterned masking layer 52 may vary depending upon the particular application. For example, the openings 52A may also have a substantially rectangular configuration when viewed from above. In one particular embodiment, the patterned masking layer 52 may be formed with substantially square-shaped openings 52A that have a side length that falls within the range of about 10-1000 nm. With reference to FIG. 2C, the width 52W of the line-type features that form the patterned masking layer 52 may also vary depending upon the particular application, e.g., 5-100 nm, and the width 52W of the line-type features that make up the patterned masking layer 52 need not be uniform across the entire patterned masking layer 52.

FIGS. 2E-2G depict the device after an etching process has been performed through the patterned masking layer 52 on the exposed portions 50A of the Group IV substrate 50. This etching process results in the formation of a plurality of dimples or indentations 54 in the surface of the Group IV substrate 50. In one embodiment, the width 52W of the line-type features of the patterned masking layer 52 is selected such that there will be some desirable undercutting, as depicted within the dashed line 56, under the features of the patterned masking layer 52. In the depicted example, the dimples 54 are shown as having very sharp, linear edges. However, as discussed more fully below, the cross-section shape of the dimples 54 may vary from the idealized situation depicted in FIGS. 2F-2G. In one illustrative embodiment, the dimples 54 take the form of a substantially inverted pyramid configuration. In one illustrative embodiment, the etching process that is performed to form the dimples 54 may be an isotropic etching process or an anisotropic etching process (or a combination of isotropic/anisotropic etching processes) using, for example, an HCl-based or a KOH-based etch chemistry. Other etch chemistries are also possible. In one example, the dimples 54 may be formed by performing an initial dry anisotropic etching process to an initial depth of about one-half the final depth of the dimples 54 and, thereafter, performing a wet etching process using an HCl-based or a KOH-based etch chemistry. It should be noted that an anisotropic etching process may exhibit a lower etch rate in the <111> direction than it does in other crystalline directions which may result in the dimple profile with {111} surfaces.

FIG. 2H is a plan view of the substrate 50 after the dimples 54 have been formed in the surface of the substrate 50 and after the patterned mask layer 52 has been removed. With reference to FIGS. 2F-2H, the etching process above results in the formation of a plurality of dimples 54 that are positioned side-by-side across the entire surface of the substrate 50. The upper surface of each of the dimples 54 is defined by a plurality of ridges 54A, 54B that, in one embodiment, are oriented approximately orthogonally relative to one another. The ridges 54A, 54B are depicted with darker lines in FIG. 2H for ease of viewing. FIG. 2I is a view of FIG. 2H wherein a single dimple 54 is depicted and otherwise only the ridges 54A, 54B that are formed in the substrate 50 are shown. As can be seen in FIG. 2I, the upper surface of the dimple 54 is defined by the intersection of four ridges, two ridges 54A, and two ridges 54B. The ridges 54A, 54B are positioned in substantially the same plane as was the original surface of the substrate 50 before it was etched. In practice, the ridges 54A, 54B may not have the very sharp edge that is depicted in FIGS. 2F-2G, i.e., they may be somewhat rounded or even a very small planar land surface as depicted to the right of FIG. 2I. Thus, in one aspect disclosed herein, the Group IV substrate 50 is formed with a ridged surface 51 comprised of a plurality of intersecting ridges 54A, 54B that, in one embodiment, may be oriented approximately 90 degrees relative to one another.

FIGS. 2J-2K depict the device after several process operations were performed. The cross-sectional views in FIGS. 2J, 2K are taken at the same location as those of FIGS. 2F, 2G, respectively. First, the patterned masking layer 52 was removed by performing one or more etching processes. Thereafter, a Group III-V material layer 60 was epitaxially deposited above the Group IV substrate 50 with the dimples 54 formed therein. The thickness 60T of the Group III-V material layer 60 may vary depending upon the application, e.g., 10 nm-5 μm.

FIGS. 2L-2M are provided to show additional details about various forms and configurations of the dimples 54 generally described above. FIG. 2L depicts the device in the illustrative case where a dimple 54 is defined by four substantially planar sidewall surfaces 55, only two of which are depicted in FIG. 2L. The cross-sectional view associated with the arrow 58, which rotated ninety degrees relative to the view depicted in FIG. 2L, shows the other two substantially planar sidewalls 55A of the dimple 54. Note that each of the substantially planar sidewalls 55, 55A have substantially triangular-shaped surfaces when viewed from the front, as depicted in the cross-sectional view associated with the arrow 58. In this embodiment, the substantially planar sidewalls 55, 55A may be positioned in or near the {111} plane of the substrate 50. In such an embodiment, the included angle 57 between the opposing pair of substantially planar sidewalls 55 and the opposing pair of the substantially planar sidewalls 55A may fall within the range of about 70 degrees. The depth 59 of the dimples 54 may vary depending upon the particular application, e.g., 10-500 nm. Also note that the four sidewalls that define the dimple 54 meet at a common point or region 55P (depending upon whether the sidewalls 55, 55A are planar or non-planar surfaces).

FIG. 2M depicts an embodiment of the device wherein the dimples 54 are defined by non-planar surfaces 55N. That is, the etching process that was performed to form the dimples 54 does not result in substantially planar surfaces that define the dimples 54. The degree of rounding or non-planarity of the surfaces 55N may vary depending upon the particular application. In some cases, even the non-planar surfaces 55N may also be positioned near the {111} plane of the substrate 50.

Using the methods disclosed herein, the Group IV substrate 50 has a surface that is comprised of a substantially uniform density of "atom-steps", i.e., the dimples 54 that are uniformly formed side-by-side across the substrate. The presence of the dimples 54, i.e., atomic steps, on the Group IV substrate 50 can be subjected to an anneal process to form "double-steps" so as to effectively reduce the number of anti-phase boundaries that may be formed in the Group III-V material layer 60. In one illustrative embodiment, the anneal process may be an RTA anneal performed at a temperate within the range of 600-1000° C. for a duration of about 5-300 seconds.

The method disclosed herein may also be employed in forming discrete, isolated regions of Group III-V material above a Group IV substrate by using, for example, aspect-ratio-trapping techniques. The cross-sectional views in FIGS. 2N, 2O are taken at the same location as those of FIGS. 2F, 2G, respectively. Initially, a layer of insulating material 70, e.g., silicon dioxide, is formed above the Group IV substrate 50 by performing any of a variety of known processes, e.g., CVD. In one embodiment, the layer of insulating material 70 may be formed to a desired thickness of an isolation region (not shown) that will be formed to electrically isolate the discrete region of Group III-V material that will be formed above the substrate 50.

FIGS. 2P-2Q depict the device after an etching process has been performed on the layer of insulating material 70 through a patterned etch mask, such as a patterned layer of photoresist material, to define a patterned layer of insulating material 70A. The cross-sectional views in FIGS. 2P, 2Q are taken at the same location as those of FIGS. 2N, 2O, respectively. As a result of this patterning process, an isolation region 72 is formed and a plurality of isolated features 74 are formed in the patterned layer of insulating material 70A. In general, the isolated features 74 in the patterned layer of insulating material 70A define a patterned etch mask that will be used like the previously described etch mask 52 to etch the dimples 54 into the exposed portions 50B of the substrate 50 in the bottom of the trench 80 defined by the isolation region 72.

FIGS. 2R-2S depict the device after the previously described etching process was performed through the patterned layer of insulating material 70A on the exposed portions 50B of the Group IV substrate 50. This etching process results in the formation of the plurality of dimples 54 in the surface of the Group IV substrate 50 within the trench 80, i.e., in the bottom of the trench. In one embodiment, as before, the width of the isolated features 74 of the patterned layer of insulating material 70A is selected such that there will be some desirable undercutting under the isolated features 74 during the etching process. In the depicted example, the dimples 54 are shown as having very sharp, linear edges. However, as discussed more fully above, the cross-sectional shape of the dimples 54 may vary from the idealized situation depicted in FIGS. 2R-2S. As before, the dimples 54 within the trench 80 are defined by a plurality of intersecting ridges 54A, 54B at the bottom of the trench 80. That is, in this embodiment, a localized surface of the substrate 50 is formed so as to have a ridged surface that is comprise of intersecting ridges.

FIGS. 2T-2U depict the device after an etching process was performed on the patterned layer of insulating material 70A through a patterned etch mask (not shown), such as a patterned layer of photoresist material, that covered the STI regions 72 but left the isolated features 74 of the patterned layer of insulating material 70A exposed. The cross-sectional views in FIGS. 2T, 2U are taken at the same location as those of FIGS. 2R, 2S, respectively. As a result of this etching process, the isolated features 74 are removed and the trench 80 having a length 80L and a width 80W is formed above the dimples 54 formed in the bottom of the trench 80, i.e., in the substrate 50. The length and width of the trench 80 may vary depending upon the particular application.

FIGS. 2V-2W depict the device after several process operations were performed. The cross-sectional views in FIGS. 2V, 2W are taken at the same location as those of FIGS. 2T, 2U, respectively. First, the previously described Group III-V material layer 60 was epitaxially deposited in the trench 80 above the dimples 54 formed in the bottom of the trench 80. Thereafter, a chemical mechanical polishing process was performed to remove excess portions, if any, of the Group III-V material layer 60 positioned outside of the trench 80. If desired, instead of using a portion of the patterned layer of insulating material 70A, i.e., the features 74, as an etch mask, the trench 80 could have been initially formed so as to expose the surface of the Group IV substrate 50 within the trench 80. Thereafter, a smaller version of the patterned masking layer 52 could be formed on the bottom of the trench 80. Next, the above-described etch process would then be performed through the mask layer formed above the bottom of the trench 80 to define the dimples 54 in the substrate 50.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a layer of insulating material above a surface of a semiconductor substrate;
    performing a first etching process on said layer of insulating material to define a patterned layer of insulating material that is comprised of isolation regions and a trench defined between said isolation regions with a plurality of isolated features formed within said trench, wherein portions of said surface of said substrate within said trench are exposed;
    performing at least one second etching process through said patterned layer of insulating material to define a plurality of intersecting ridges that define a ridged surface in said substrate within said trench;
    after forming said ridged surface in said substrate, performing a third etching process to remove said plurality of isolated features within said trench; and
    after removing said plurality of isolated features, forming a Group III-V material on said ridged surface of said substrate within said trench between said isolation regions.

2. The method of claim 1, wherein said substrate is a Group IV (001) substrate.

3. The method of claim 1, wherein said intersecting ridges are oriented approximately 90 degrees relative to one another.

4. The method of claim 1, wherein performing said at least one second etching process through said patterned layer of insulating material further defines a plurality of dimples positioned side-by-side in said substrate.

5. The method of claim 4, wherein each of said plurality of dimples is defined by four surfaces that connect at a common region.

6. The method of claim 5, wherein said common region is a common point.

7. The method of claim 5, wherein said four surfaces are substantially planar surfaces.

8. The method of claim 5, wherein each of said four surfaces are positioned near a {111} plane of said substrate.

9. The method of claim 5, wherein said four surfaces are substantially non-planar surfaces.

10. The method of claim 1, wherein forming said Group III-V material comprises:
   overfilling said trench with said Group III-V material; and
   performing a planarization process to remove portions of said Group III-V material extending outside said trench.

* * * * *